United States Patent [19]

Childers et al.

[11] Patent Number: 5,442,386
[45] Date of Patent: Aug. 15, 1995

[54] STRUCTURE AND METHOD FOR PREVENTING INK SHORTING OF CONDUCTORS CONNECTED TO PRINTHEAD

[75] Inventors: Winthrop D. Childers, San Diego; Dale D. Timm, Jr., Encinitas, both of Calif.; Charles L. Thierheimer, Jr.; Marshall Field, both of Corvallis, Oreg.; William S. Colburn, San Diego, Calif.; William R. Boucher, Corvallis; Joseph R. Elliot, Corvallis; Peter R. Stokes, Corvallis, all of Oreg.

[73] Assignee: Hewlett-Packard Company, Palo Alto, Calif.

[21] Appl. No.: 56,238

[22] Filed: Apr. 30, 1993

Related U.S. Application Data

[63] Continuation-in-part of Ser. No. 960,759, Oct. 13, 1992, abandoned.

[51] Int. Cl.⁶ .............................................. B41J 2/05
[52] U.S. Cl. .......................................... 347/50; 347/63
[58] Field of Search ............. 346/140 R, 1.1; 347/47, 347/50, 58, 63, 87

[56] References Cited

U.S. PATENT DOCUMENTS

| | | | |
|---|---|---|---|
| 4,806,106 | 2/1989 | Mebane et al. | 346/75 X |
| 5,278,584 | 1/1994 | Keefe et al. | 346/140 R |
| 5,305,015 | 4/1994 | Schantz et al. | 347/47 |

FOREIGN PATENT DOCUMENTS 0145057  6/1988  Japan .................. B41J 3/20

Primary Examiner—Mark J. Reinhart
Assistant Examiner—David Yockey

[57] ABSTRACT

In one embodiment of the invention, a flexible tape has formed on it conductors for being connected to a printhead substrate. The conductors on the tape are coated with an insulating layer, and exposed ends of the conductors extend from the layer. A headland is formed on a plastic print cartridge for receiving the printhead substrate having the exposed conductors extending from one or more edges of the printhead substrate. An adhesive bead is formed on the headland so that when the printhead is properly positioned on the headland, the adhesive contacts the conductors to encapsulate and insulate one exposed side of the conductors. A second adhesive or encapsulant bead is deposited over the opposite side of the conductors to encapsulate and insulate the remaining exposed regions of the conductors. In this manner, the combined insulating action of the insulating layer and the two insulating adhesive beads prevents the conductors from being shorted together by ink which may flow in the vicinity of the conductors.

10 Claims, 12 Drawing Sheets

STRUCTURE AND METHOD FOR PREVENTING INK SHORTING OF CONDUCTORS CONNECTED TO PRINTHEAD

CROSS-REFERENCE TO RELATED APPLICATIONS

This application is a Continuation-in-Part of U.S. application Ser. No. 07/960,759 abandoned, filed Oct. 13, 1992, entitled, "Structure and Method for Preventing Ink Shorting of Conductors Connected to a Printhead" by Winthrop D. Childers, Dale D. Timm, Jr., Charles L. Thierheimer, Jr., Marshall Field, and William S. Colburn.

This application also relates to the subject matter disclosed in the U.S. application Ser. No. 07/864,930 now U.S. Pat. No. 5,297,331, filed April 2, 1992, entitled "Structure and Method for Aligning a Substrate With Respect to Orifices in an Inkjet Printhead," by Winthrop Childers. The above-mentioned patent application is incorporated herein by reference. The structure and method described in the present application can be utilized, along with the production techniques described in the above-identified patent application, to fabricate a state-of-the-art print cartridge incorporating the present invention.

FIELD OF THE INVENTION

This invention relates to ink printers, and more particularly to an improved structure for preventing ink shorts between conductors connected to a printhead.

BACKGROUND OF THE INVENTION

Thermal inkjet print cartridges operate by rapidly heating a small volume of ink to cause the ink to vaporize and be ejected through one of a plurality of orifices so as to print a dot of ink on a recording medium, such as a sheet of paper. Typically, the orifices are arranged in one or more linear arrays in a nozzle plate. The properly sequenced ejection of ink from each orifice causes characters or other images to be printed upon the paper as the printhead is moved across the paper. The paper is typically shifted each time the printhead has moved across the paper. The thermal inkjet printer is fast and quiet, as only the ink strikes the paper. These printers produce high quality printing and can be made both compact and affordable.

One particular example of a prior art inkjet print cartridge is shown in FIG. 1a as print cartridge 10. Print cartridge 10 includes an ink reservoir 12 for containing liquid ink. The liquid ink is delivered to a printhead 14, and resistors within the printhead 14 are selectively energized to vaporize a small portion of ink, which is then expelled through an associated orifice, such as orifice 16. Orifices 16 are formed in a nozzle plate 18, typically formed of nickel, which is secured over a substrate containing the resistors.

To provide current to each of the resistors, conductors within a flexible circuit 22 are connected to the appropriate electrodes on the substrate. These conductors are terminated by contact pads 23 exposed on the surface of flexible circuit 22. When cartridge 10 is properly positioned in an inkjet printer, contact pads 23 are pressed against associated contacts on the inkjet printer so as to electrically couple the resistors to a source of electrical current.

A close-up view within the circled portion 1b in FIG. 1a is shown in FIG. 1b. FIG. 1b shows more detail of nozzle plate 18 incorporating orifices 16 and additionally shows conductors 24 formed on the underside of flexible circuit 22.

Also illustrated in FIG. 1b is a barrier layer 26, which separates nozzle plate 18 and a substrate 28, wherein barrier layer 26 provides the ink manifold and vaporization chambers into which ink flows from ink reservoir 12 for vaporization by the energized resistors formed on substrate 28.

FIG. 1c illustrates printhead 14 removed from print cartridge 10. FIG. 1c shows nozzle plate 18 partially cut away to reveal the pattern formed in barrier layer 26. Substrate 28 is shown having thin film resistors 30 formed thereon and also having metal electrodes, such as electrode 32, formed thereon connected to each of resistors 30. Conductors 24 (FIG. 1b) are aligned with electrodes 32 and permanently secured to electrodes 32 using automated bonding or tacking equipment, such as a TAB bonder.

Ink flows from the back of substrate 28 through a center slot 34 and into each of the vaporization chambers 36. When a resistor 30 is energized and thus heated, the ink within a vaporization chamber 36 is vaporized and is expelled through an associated orifice 16 formed in nozzle plate 18.

FIG. 1d is a cross-section of a vaporization chamber 36 taken along line A—A in FIG. 1c. Shown in FIG. 1d is substrate 28, barrier layer 26, nozzle plate 18, resistor 30, orifice 16, vaporization chamber 36, expelled ink droplet 38, and recording medium 40. In operation, ink fills vaporization chamber 36, and resistor 30 is energized. The ink within vaporization chamber 36 is evaporated and expelled as droplet 38 through ink orifice 16. Expelled droplet 38 then forms a dot on the recording medium 40.

The print cartridge structure 10 shown in FIGS. 1a and 1b has a number of drawbacks. Since this disclosure is directed to an improved insulation system for preventing ink shorting of conductors, only the drawbacks relating to the shorting together of conductors 24 by ink will be discussed.

As illustrated in FIGS. 1b and 1c, conductors 24 extend out from flexible circuit 22 and connect to electrodes 32 on substrate 28. There is no insulation on the bottom surface of conductors 24 formed on the bottom surface of flexible circuit 22. During the course of printing, cleaning operations need to be done to prevent nozzles 16 from clogging. In addition spray from the ink ejection is generated. As a result, the ink manages to reach the underside of flexible circuit 22, which causes some degree of shorting between conductors 24. At low voltage levels and at fairly low operating speeds, this shorting together of conductors 24 only moderately affects the operation of printhead 14. However, future generation of printheads will require faster and faster speeds and possibly incorporate active demultiplexing circuitry on the printhead itself. Thus, high current power supply voltages and low current control signals will be carried by conductors connected to future printheads. Ink shorting between these conductors will significantly affect the characteristics of the control signals and will, therefore, cause significant fluctuations in print quality.

Accordingly, what is needed is a structure for preventing any shorting by ink between conductors leading to electrodes on a printhead substrate.

SUMMARY OF THE INVENTION

The present invention includes an improved structure for an inkjet print cartridge and a method for securing a printhead to the cartridge, whereby ink is prevented from shorting the printhead conductors together.

In one embodiment of the invention, conductors formed on a surface of a flexible circuit are encapsulated by a layer of insulation to prevent ink seeping under the flexible circuit from shorting the conductors together. Additionally, a headland is formed on a plastic print cartridge for receiving a printhead connected to the conductors on the flexible circuit, where exposed conductors from the flexible circuit extend from one or more edges of the printhead. An adhesive bead is formed on the headland so that when the printhead is properly positioned on the headland, the adhesive is displaced up to encapsulate and insulate the exposed portions of the conductors up to the edge of the layer of insulation. An encapsulant bead may then be deposited over any remaining exposed portion of the conductors. Thus, the conductors cannot be shorted together by ink which may flow in the vicinity of the conductors.

BRIEF DESCRIPTION OF THE DRAWINGS

The present invention can be further understood by reference to the following description and attached drawings which illustrate the preferred embodiment.

Other features and advantages will be apparent from the following detailed description of the preferred embodiment, taken in conjunction with the accompanying drawings, which illustrate, by way of example, the principles of the invention.

FIG. 1c is a perspective view, partially cut away, of the front surface of the printhead removed from the print cartridge of FIG. 1a.

DETAILED DESCRIPTION OF THE PREFERRED EMBODIMENTS

The present invention prevents liquid ink from shorting together conductors connected to a printhead. A brief description of a preferred embodiment printhead/conductor structure will first be given followed by a description of the invention.

Figure 2:
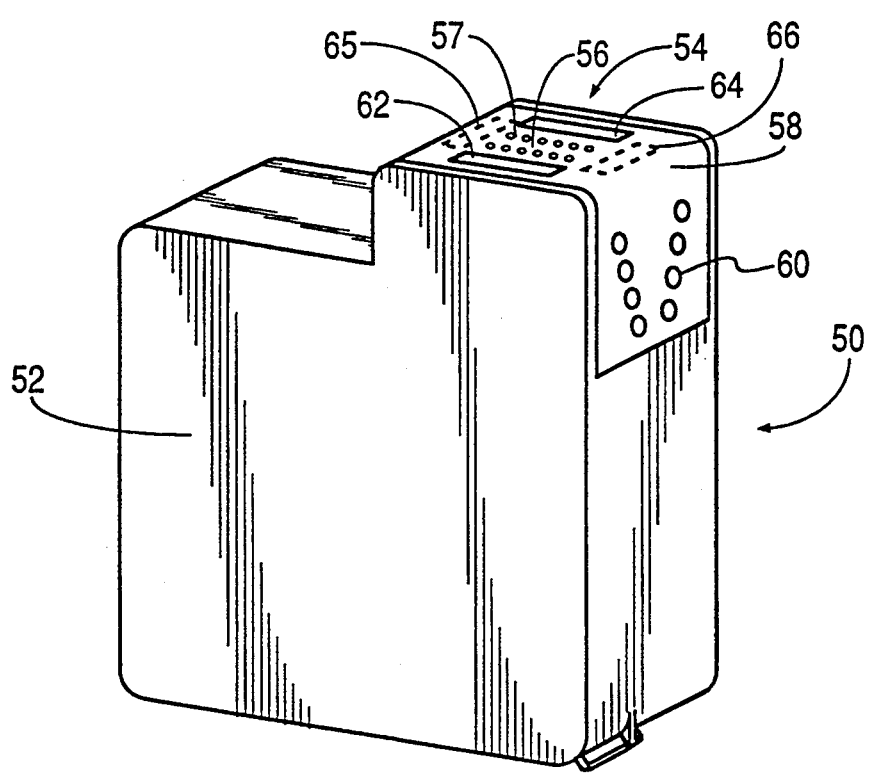
FIG. 2 is a perspective view of an inkjet print cartridge according to one embodiment of the present invention.

Referring to FIG. 2, reference numeral 50 generally indicates an inkjet print cartridge incorporating one embodiment of the present invention. Inkjet print cartridge 50 includes an ink reservoir 52 and a printhead 54, where printhead 54 is formed, in one embodiment, using Tape Automated Bonding (TAB).

The particular structure of the printhead is not important in this patent application, and various types of printheads, such as those with a nickel nozzle plate, may also be used with the present invention.

Printhead 54 includes a nozzle member 56 comprising two parallel columns of offset holes or orifices 57 formed in a flexible polymer tape 58 by, for example, laser ablation. Tape 58 may be purchased commercially as KAPTON TM tape, available from 3M Corporation. Other suitable tape may be formed of UPILEX TM or its equivalent.

In another embodiment orifices 57 are formed in a separate nickel nozzle plate.

A back surface of tape 58 includes conductors 72 (shown in FIG. 3) formed thereon using a conventional photolithographic etching and/or plating process. These conductors are terminated by large contact pads 60 designed to interconnect with a printer. Print cartridge 50 is designed to be installed in a printer so that contact pads 60, on the front surface of tape 58, contact printer electrodes providing externally generated energization signals to the printhead.

In the various embodiments shown, the conductors are formed on the back surface of tape 58 (opposite the surface which faces the recording medium). To access these conductors from the front surface of tape 58, holes (vias) must be formed through the front surface of tape 58 to expose the ends of the conductors. The exposed ends of the conductors are then plated with, for example, gold to form contact pads 60 shown on the front surface of tape 58.

Windows 62 and 64 extend through tape 58 and are used to facilitate bonding of the other ends of the conductors to electrodes on a silicon substrate containing heater resistors. Windows 62 and 64 are filled with an encapsulant to protect any exposed portions of the conductors and the substrate.

Figure 10:
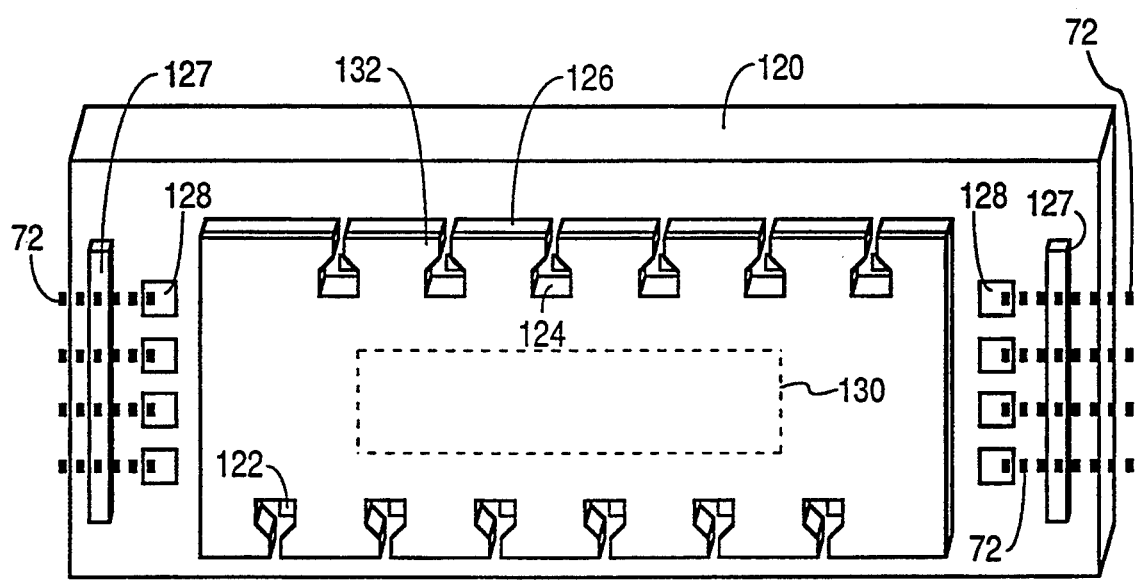
FIG. 10 is a perspective view of another embodiment of a substrate structure containing heater resistors and vaporization chambers, which may be mounted on the back of the printhead assembly of FIG. 3.
Figure 11:
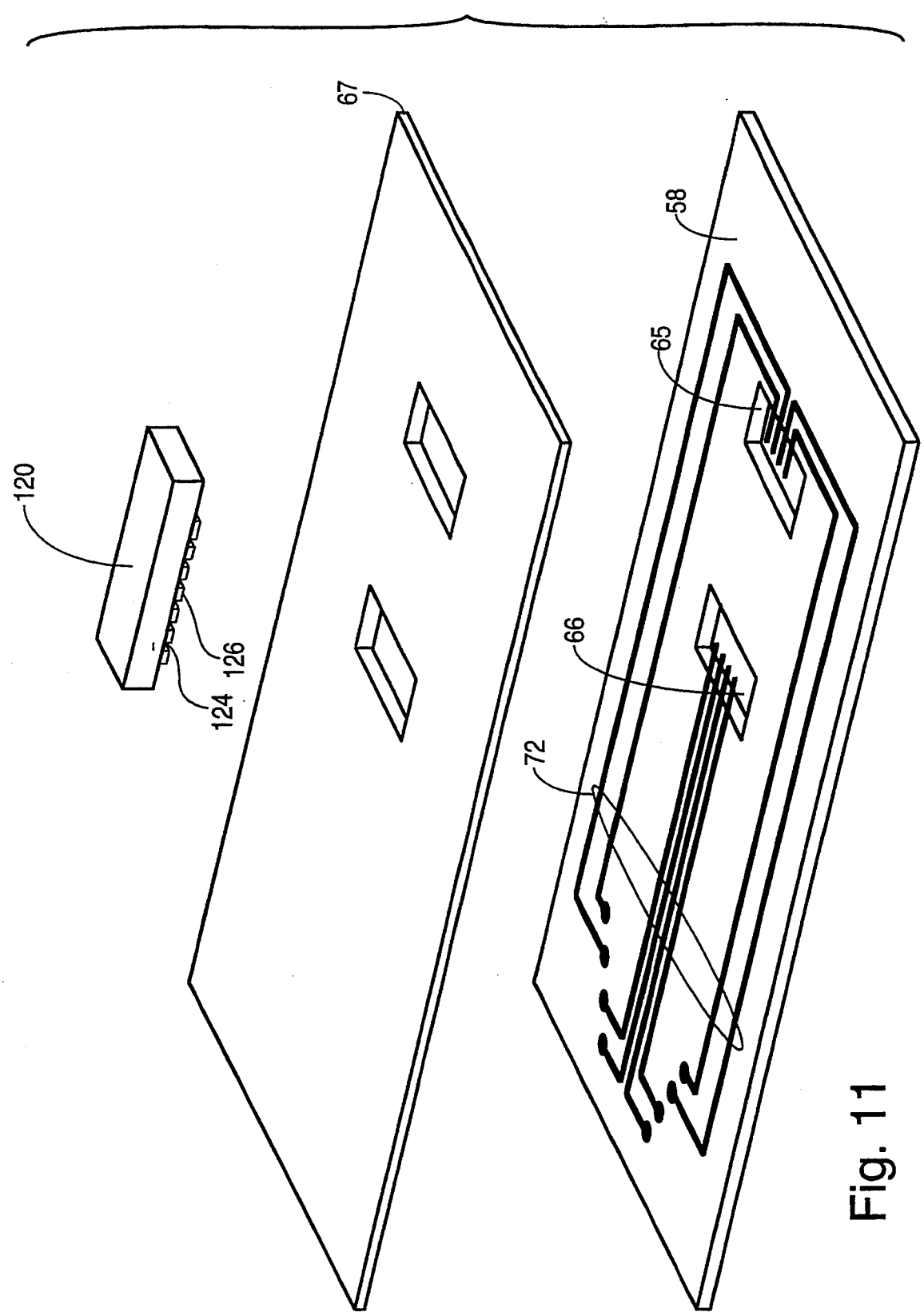
FIG. 11 is an exploded perspective view of the back surface of the printhead assembly of FIG. 3 but with the printhead of FIG. 11 mounted on the back of the printhead assembly.
Figure 12:
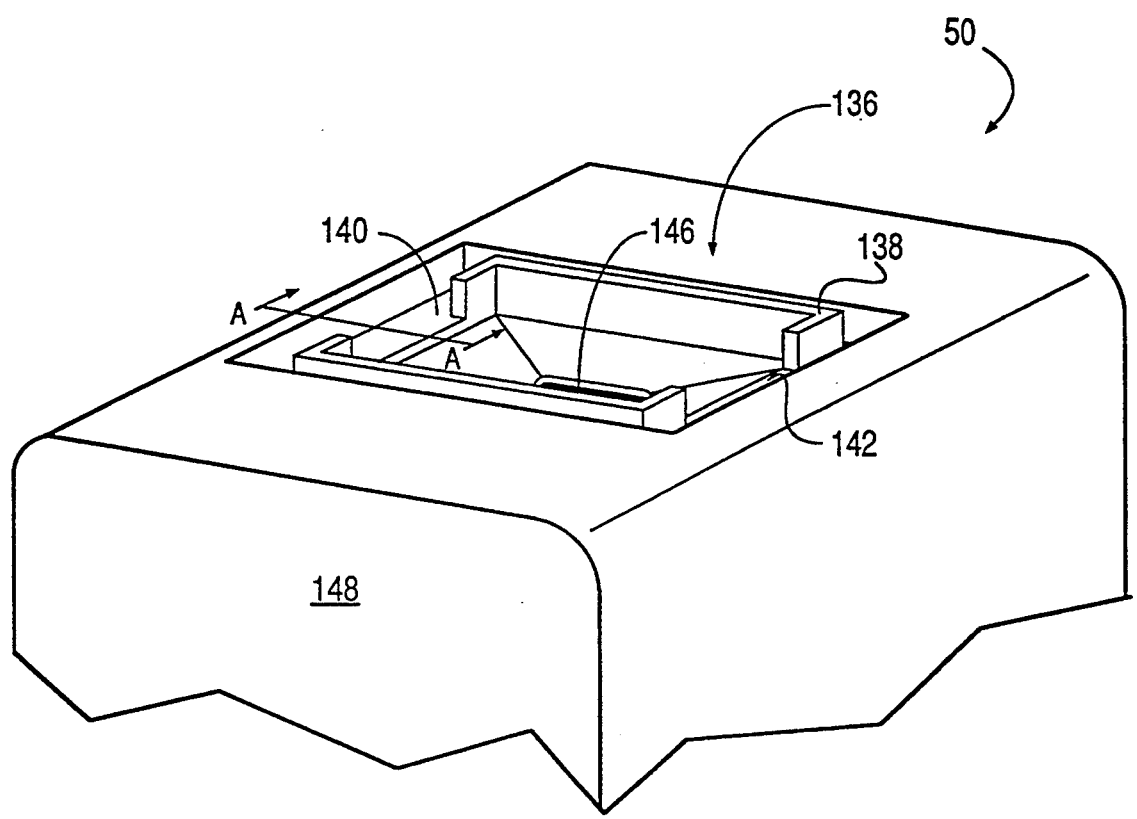
FIG. 12 is a perspective view of a portion of a third embodiment of the inkjet print cartridge of FIG. 2 with the printhead assembly of FIG. 11 removed.

In another embodiment, described with respect to FIGS. 10–12, windows 65 and 66 (shown in dashed outline) are used instead of windows 62 and 64 to facilitate bonding of the conductors to electrodes on a silicon substrate.

Figure 3:
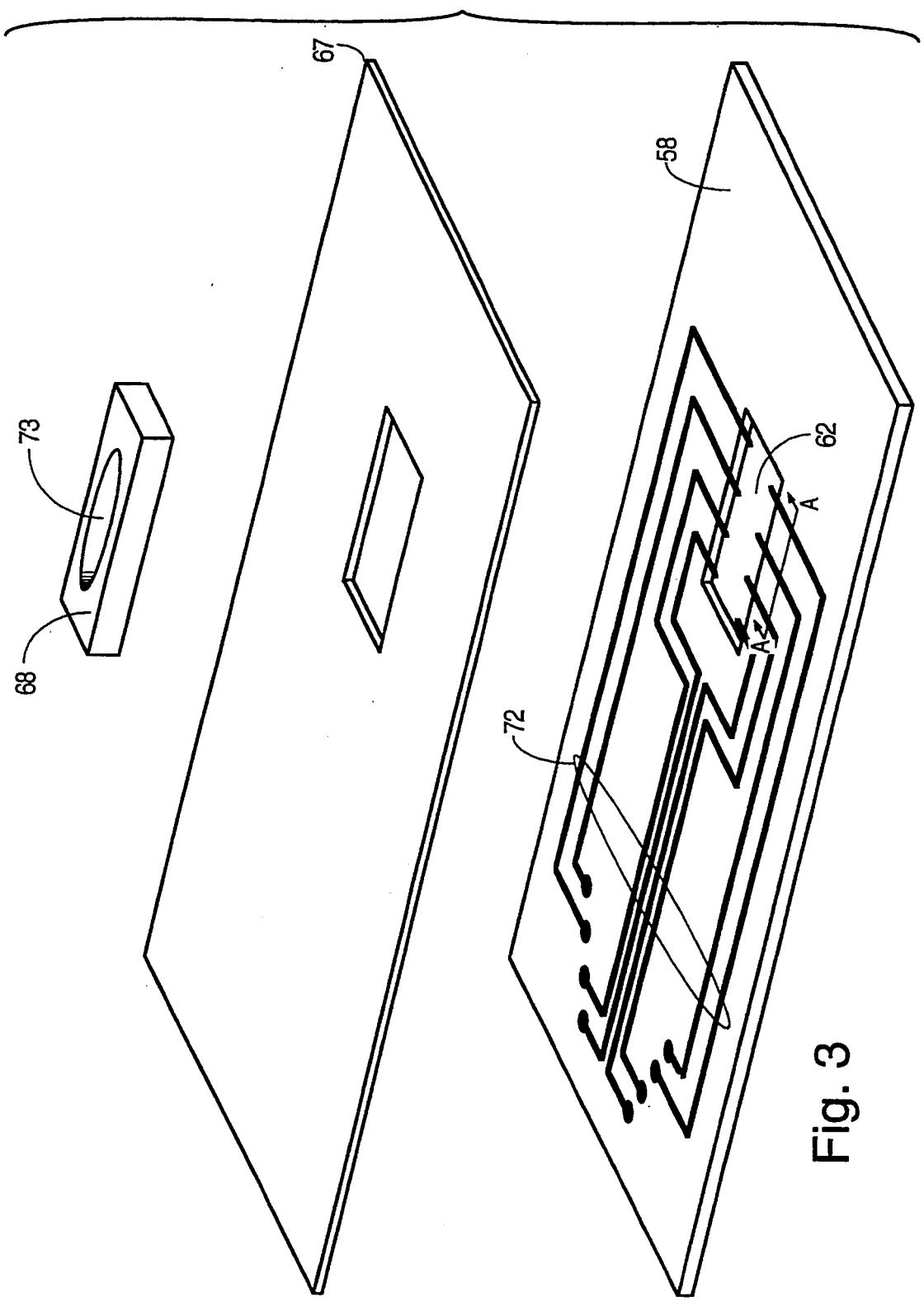
FIG. 3 is an exploded perspective view of the back surface of the printhead assembly (or tape) of FIG. 2 with a silicon substrate mounted thereon and the conductive leads attached to the substrate.

In the preferred embodiment, the back surface of tape 58 on which the conductors are formed has a first adhesive layer formed on it, followed by a layer of polyethylene terephthalates (PET), followed by a second layer of adhesive. The three-layer adhesive/PET coating encapsulates and insulates the conductors to protect the encapsulated portion of the conductors on tape 58 from ink shorting. In the preferred embodiment, a coating 67, shown in FIG. 3, is laminated to the back side of tape 58 on which the conductors 72 are formed. The coating 67 has three layers that consist of a polyethylene terephthalate (PET) core coated with a first layer of adhesive on one side and a second layer of adhesive on the other side. The adhesive layers are typically applied by a plastic film manufacturer or converter. The adhesive may be thermoplastic, thermosetting, or have some combination of these properties. Prior to attaching the coating 67 to tape 58, the coating 67 is punched to a shape matching the area of tape 58 to be coated. The PET layer, having better structural integrity than the adhesive, makes this punching operation more feasible. At room temperature, the adhesive is in a solid state. When the coating 67 is laminated to the back side of tape 58 (over the conductors), heat and pressure are used to temporarily soften the first adhesive to enhance adhesion to tape 58 and assure that conductors 72 are encapsulated adequately. The PET layer has a second function of assuring that coating 67 has no holes that would allow ink to flow through and reach conductors 72. In summary, the three layer structure allows for easier material handling, adhesion to tape 58, adhesion to the print cartridge 50 material, and fluidic sealing of conductors 72 from the ink. Although a three layer structure is preferred, a single layer may be adequate if the layer can provide the required structural properties.

Additional detail regarding the three-layer adhesive/PET coating 67 is described later with respect to FIGS. 13a–13d.

The resulting tape 58 with the printhead is then positioned on the print cartridge "snout" and heated so that the second layer of adhesive covering the conductors now secures tape 58 to print cartridge 50. In one embodiment, the second adhesive has a lower melting point than the first adhesive to ensure that tape 58 does not separate from the first adhesive while affixing the second adhesive to the snout of the print cartridge 50.

FIG. 3 is an exploded view showing a back of tape 58 removed from print cartridge 50 and prior to windows 62 and 64 being filled with an encapsulant.

Figure 1A:
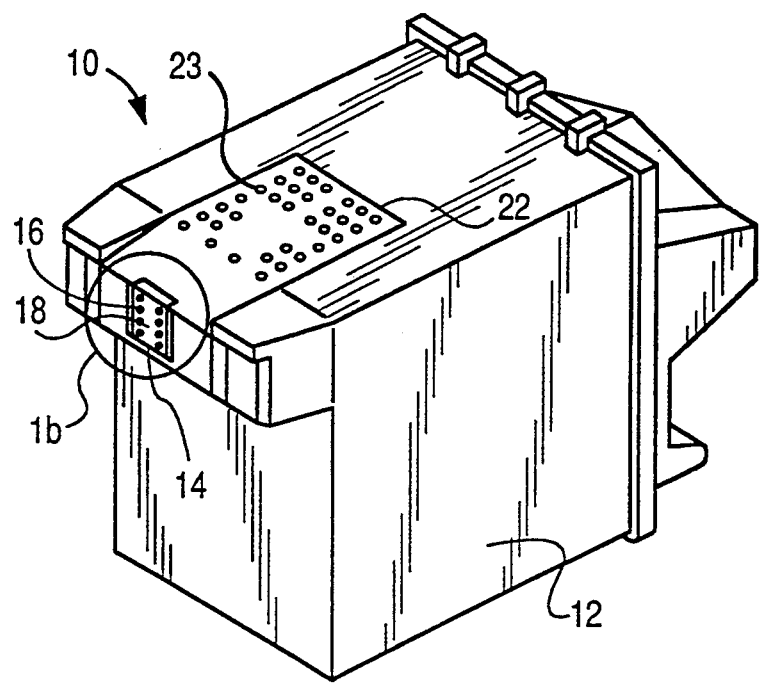
FIG. 1a is a perspective view of a prior art inkjet print cartridge.
Figure 1B:
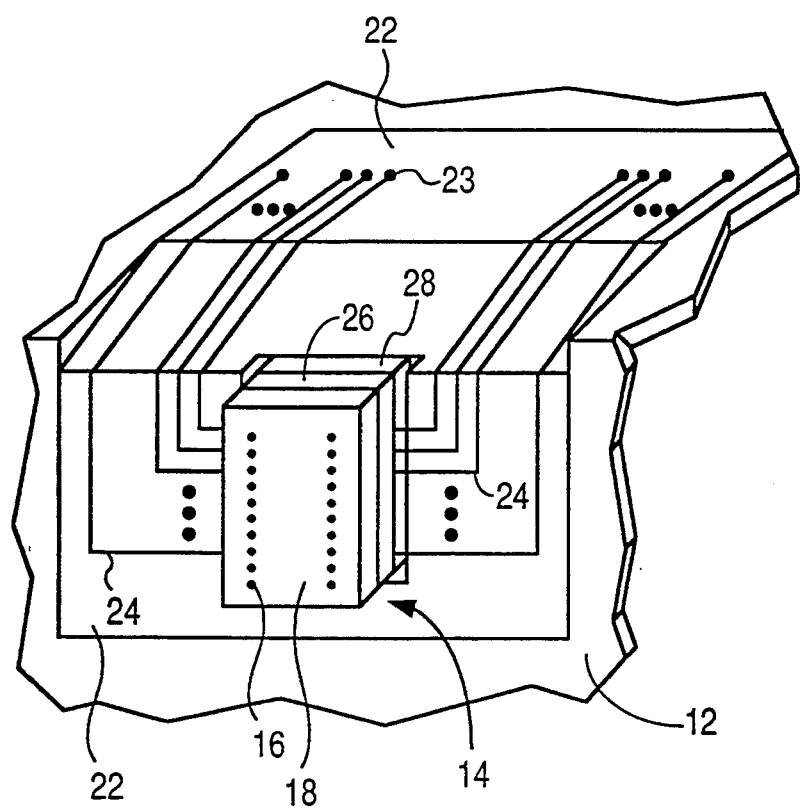
FIG. 1b is a perspective view, enlarged, of the portion of the print cartridge in FIG. 1a identified in the circle labelled 1b.
Figure 1C:
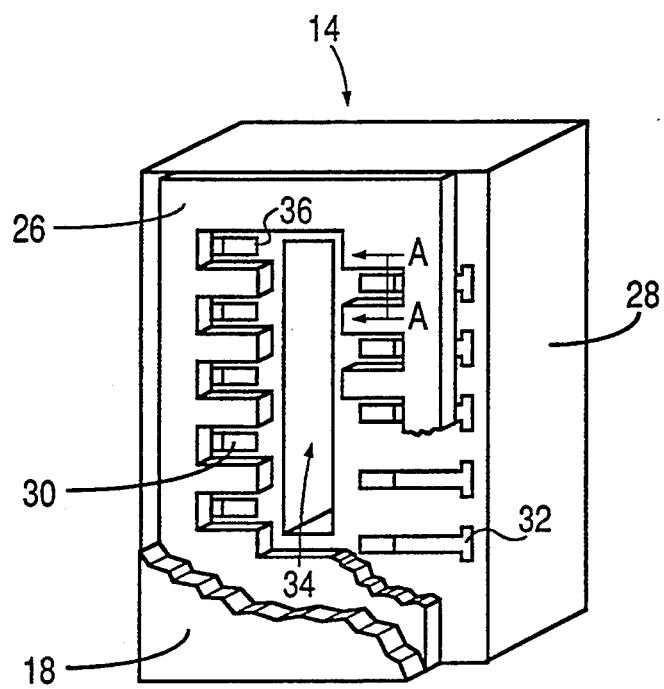
Figure 1D:
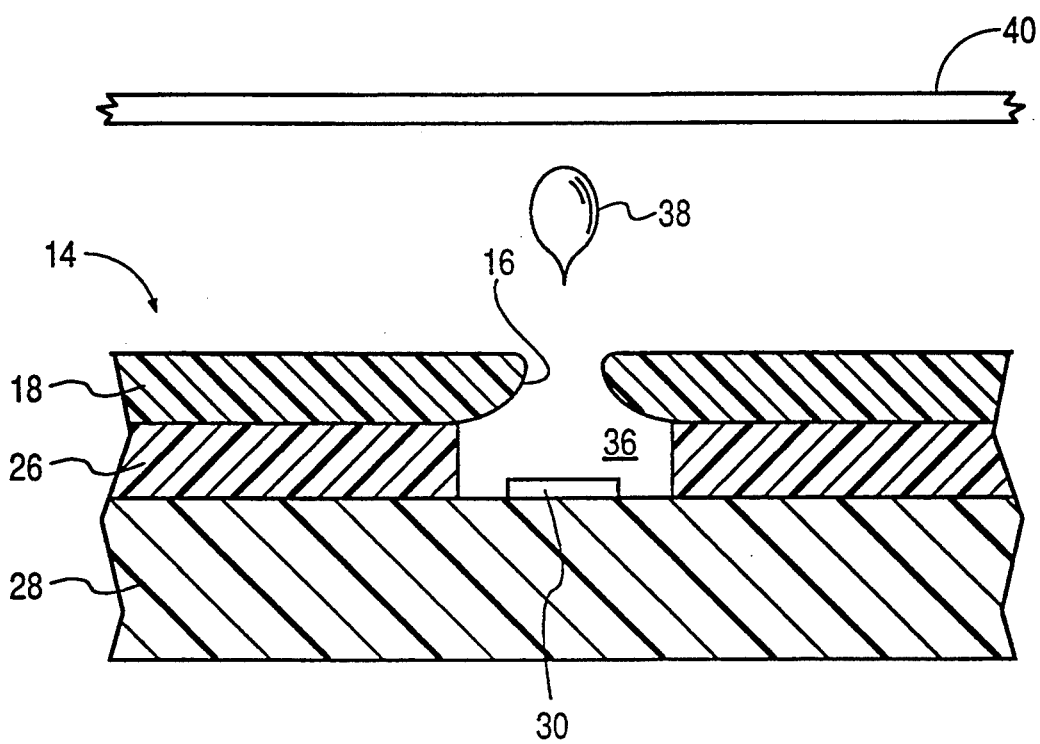
FIG. 1d is a side elevational view in cross-section taken along line A—A in FIG. 1c, but including a nozzle plate, illustrating the ejection of a droplet of ink from an orifice in the printhead.

Affixed to the back of tape 58 is a silicon substrate 68 containing a plurality of individually energizable thin film resistors. This silicon substrate may be similar to that shown in FIG. 1c. Each resistor is located generally behind a single orifice 57 (FIG. 2) and acts as an ohmic heater when selectively energized by one or more pulses applied sequentially or simultaneously to one or more of contact pads 60 (FIG. 2). Conductors 72 lead from the contact pads 60 to electrodes on substrate 68. Hole 73 allows ink from an ink reservoir to flow to the front surface of substrate 68.

The relative dimensions of the various features have been greatly adjusted for the sake of clarity.

Windows 62 and 64 allow access to the ends of conductors 72 and the substrate electrodes from the other side of tape 58 to facilitate bonding.

Figure 4:
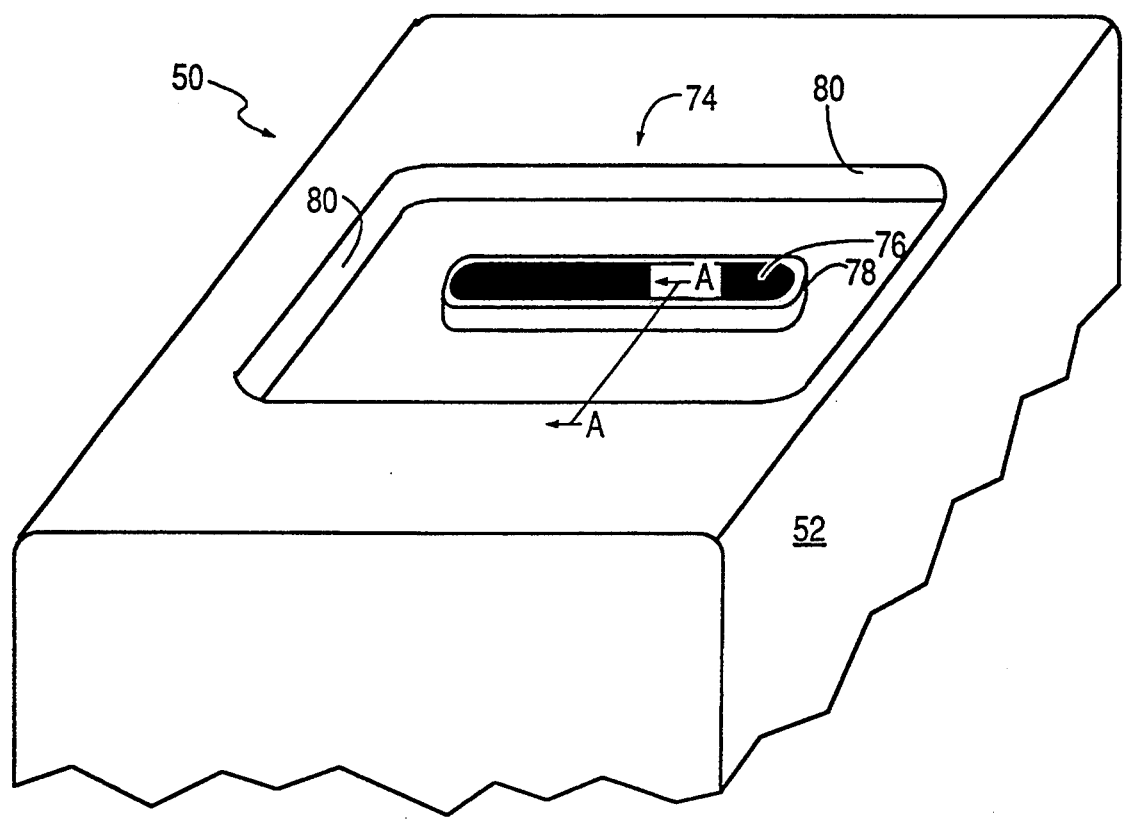
FIG. 4 is a perspective view of a portion of one embodiment of the inkjet print cartridge of FIG. 2 with the printhead assembly of FIG. 3 removed.

FIG. 4 shows print cartridge 50 of FIG. 2 with the printhead assembly removed to reveal one embodiment of a headland pattern 74 used in providing an ink seal between tape 58 (FIG. 2) and print cartridge 50. Importantly, headland pattern 74 is also designed to enable an exposed portion of conductors 72 (FIG. 3) to be encapsulated and protected from ink, as will be described in detail later. The headland 74 characteristics are exaggerated for clarity.

Also shown in FIG. 4 is a central slot 76 in print cartridge 50 for allowing ink from ink reservoir 52 (FIG. 2) to flow to the back surface of substrate 68 in FIG. 3.

To provide an ink seal between print cartridge 50 and the printhead assembly and to prevent ink shorting of conductors, an epoxy adhesive, or other suitable adhesive, is dispensed between an inner boundary or wall 78 and an outer boundary or wall 80 in FIG. 4. Alternatively, a patterned adhesive film may be positioned on the headland, as opposed to dispensing an adhesive.

Figure 5:
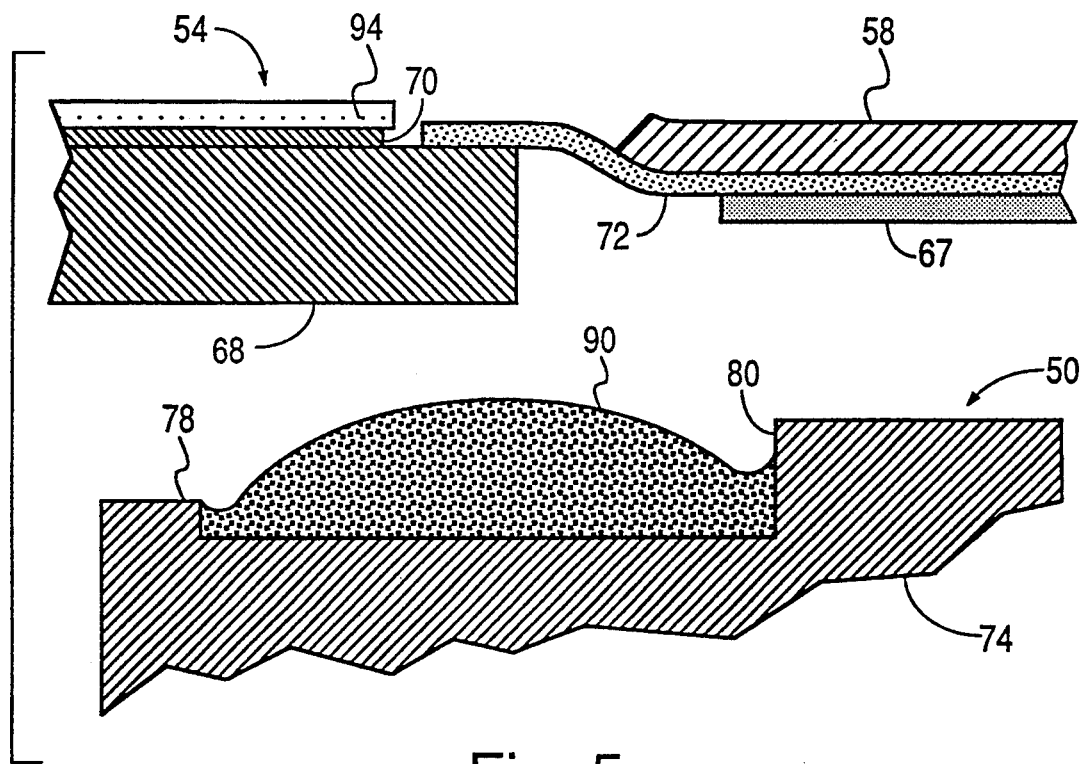
FIG. 5 is a side elevational view in cross-section taken along line A—A in FIG. 4 illustrating an adhesive being dispensed on the headland in FIG. 4 and the printhead assembly positioned over the headland.

FIG. 5 shows a side view in cross-section of print cartridge 50 along line A—A in FIG. 4 after adhesive 90 is properly dispensed on the headland pattern 74. FIG. 5 also shows one embodiment of a printhead assembly 54 including insulating tape 58, conductors 72, adhesive/PET layer 67, substrate 68, barrier layer 70, and metal nozzle plate 94. In another embodiment, metal nozzle plate 94 is, instead, a laser ablated portion of tape 58, as shown in FIG. 2.

Figure 6:
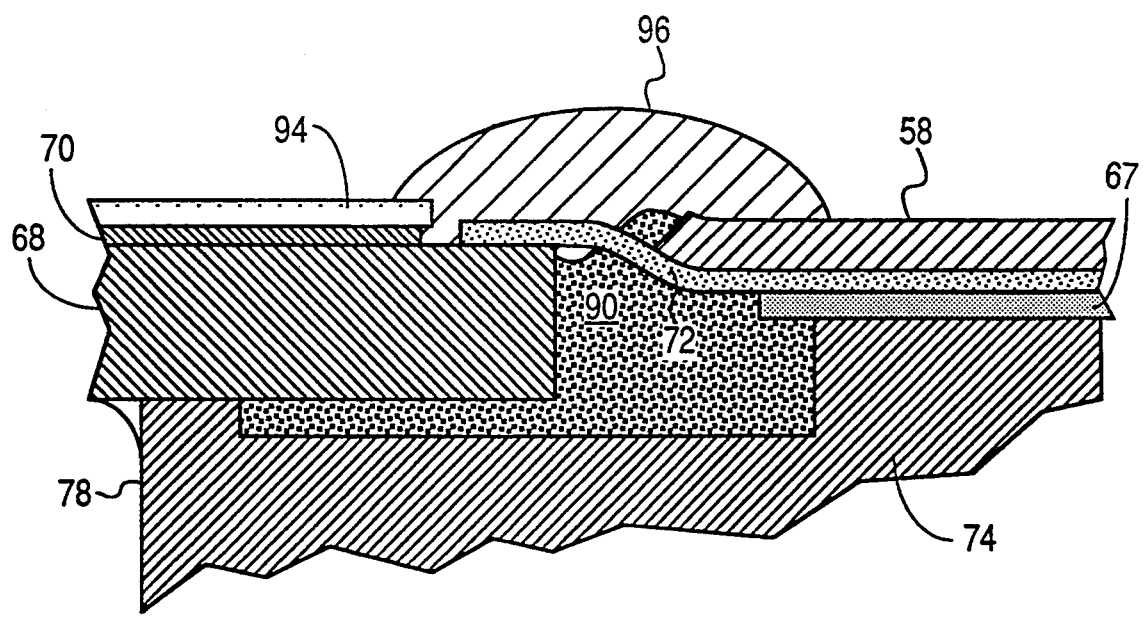
FIG. 6 illustrates the printhead assembly and headland in FIG. 5 after the printhead assembly has been positioned on the headland and the adhesive now insulating the conductors from ink.

When printhead assembly 54 is positioned on headland 74, adhesive 90 will not only secure substrate 68 to print cartridge 50 but will displace up to insulate the previously-exposed bottom surface of conductors 72, as shown in FIG. 6. Now, adhesive 90 coacts with adhesive/PET layer 67 to insulate the underside of conductors 72 from any ink. Hence, even if layer 67 does not extend to the edge of tape 58, the ends of conductors 72 will still be protected by adhesive 90.

An encapsulant bead 96, shown in FIG. 6, may then be dispensed over the top of conductors 72 and exposed substrate 68, via window 62 and 64 (FIG. 2), to protect any exposed portion of conductors 72 and substrate 68. Encapsulant bead 96 may be any type of insulating material, such as epoxy, UV curable adhesive, or their equivalent.

Thus, any ink which may seep into an area around conductors 72 cannot contact any of conductors 72, and ink shorting is prevented.

In the embodiment of FIGS. 4–6, the amount of adhesive 90 dispensed must be carefully controlled.

Figure 7:
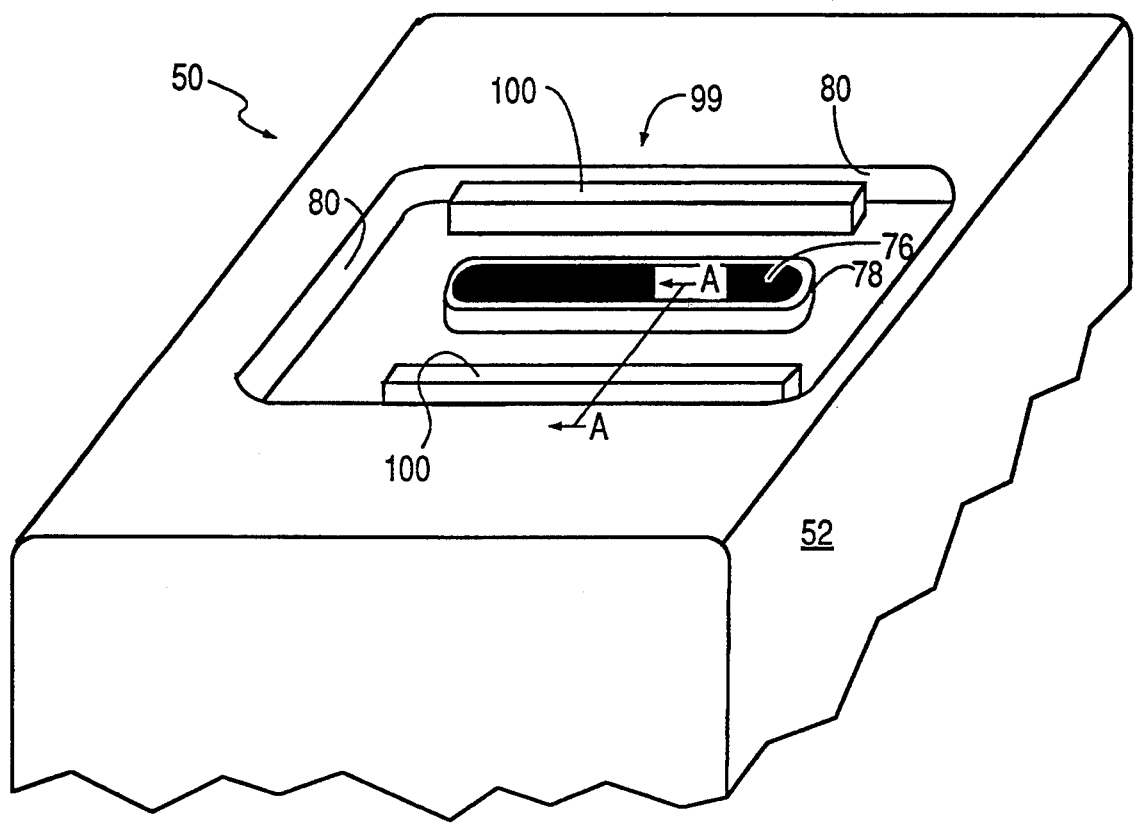
FIG. 7 is a perspective view of a portion of a second embodiment of the inkjet print cartridge of FIG. 2 with the printhead assembly of FIG. 3 removed.

The preferred embodiment of a headland for preventing ink shorts is shown in FIG. 7 as headland 99, where an additional middle wall 100 is formed between inner wall 78 and outer wall 80.

Figure 8:
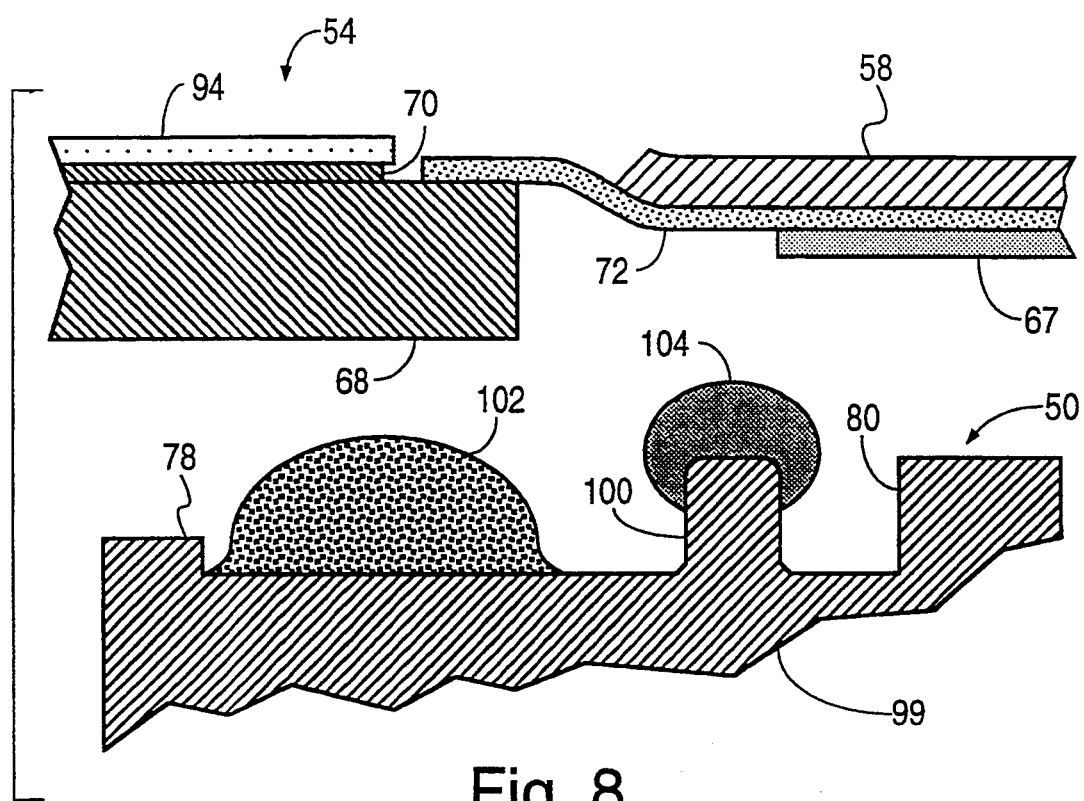
FIG. 8 is a side elevational view in cross-section taken along line A—A in FIG. 4 illustrating an adhesive being dispensed on the headland in FIG. 7 and the printhead assembly positioned over the headland.

FIG. 8 is a side view in cross-section along line A—A in FIG. 7 showing inner wall 78, middle wall 100, and outer wall 80 and also showing a first adhesive bead 102, dispensed between walls 78 and 100, and a second adhesive bead 104, dispensed on middle wall 100. The printhead structure 54 is identical to that shown in FIG. 5.

Figure 9:
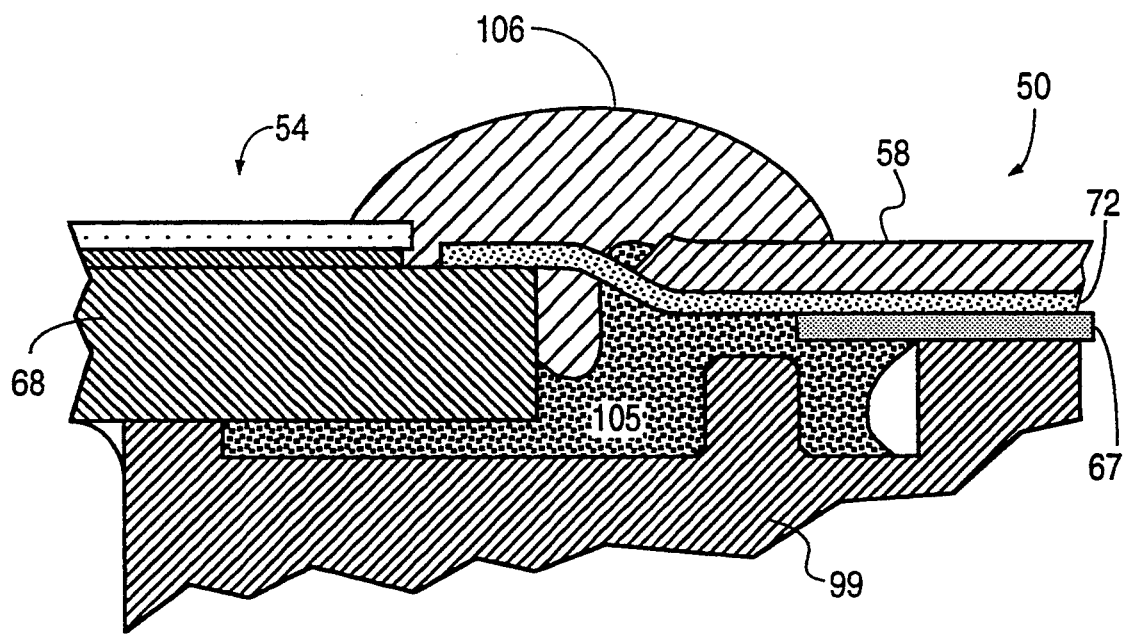
FIG. 9 illustrates the printhead assembly and headland in FIG. 8 after the printhead assembly has been positioned on the headland and the adhesive now insulating the conductors from ink.

FIG. 9 shows the resulting print cartridge 50 after printhead 54 and tape 58 have been pressed on headland pattern 99 and adhesive 104 has been displaced up to insulate the undersides of conductors 72. The first adhesive bead 102 and the second adhesive bead 104 in FIG. 8 have been merged to form an inseparable mass of adhesive 105. As seen, adhesive 1054 coacts with adhesive/PET layer 67 to insulate the underside of conductors 72 in the area of wall 100. The remaining portion of conductors 72 closest to substrate 68 and not coated by adhesive 105 will be later coated by a dispensed encapsulant bead 106, shown in FIG. 9.

Using the embodiments of FIGS. 7-9, the amount of insulation adhesive 104 may be carefully controlled independent of the amount of bonding adhesive 102. In this way, insulation adhesive 104 will more reliably insulate the underside of conductors 72.

In another embodiment, insulation adhesive 104 is not an adhesive but is only an insulating material.

Similar headland patterns and adhesives can also be used to encapsulate conductors extending from the short edge of substrate 68, where FIGS. 5 and 8 would then be cross-sectional views of a headland portion supporting the short edges of substrates 68.

FIG. 10 is a front perspective view of one embodiment of a silicon substrate 120 having conductors extending from the short edges of substrate 120. Substrate 120 may be affixed to the back of a tape similar to tape 58 in FIG. 3. Windows 65 and 66 in FIG. 2 would then be formed in tape 58 perpendicular to the rows of orifices 57, as shown in FIG. 11.

Silicon substrate 120 has formed on it, using conventional photolithographic techniques, two rows of offset thin film resistors 122, shown in FIG. 10 exposed through vaporization chambers 124 formed in a barrier layer 126. Barrier layer 126 may be a patterned layer of photoresist or some other polymer.

A portion 127 of barrier layer 126 insulates conductors 72 from the underlying substrate 120.

In one embodiment, substrate 120 is approximately one-half inch long and contains 300 heater resistors 122, thus enabling a resolution of 600 dots per inch.

Also formed on substrate 120 are electrodes 128 for connection to conductors 72 formed on the back of tape 58 in FIG. 11.

A conventional-design demultiplexer 130, shown by a dashed outline in FIG. 10, is also formed on substrate 120 for demultiplexing the incoming multiplexed signals applied to electrodes 128 and distributing the signals to the various thin film resistors 122. Demultiplexer 130 enables the use of much fewer electrodes 128 than thin film resistors 122. Having fewer electrodes allows all connections to the substrate to be made from the short end portions of the substrate, as shown in FIG. 11. In this way, barrier layer 126 may be formed to allow ink flow around the long sides of the substrate 120 and into vaporization chambers 124.

Demultiplexer 130 may be any conventional decoder for decoding encoded signals applied to electrodes 128. Demultiplexer 130 has input leads (not shown for simplicity) connected to electrodes 128 and has output leads (not shown) connected to the various resistors 122. At least one of electrodes 128 would be a high current terminal for energizing resistors 122, while other ones of electrodes 128 would be for accepting low current control voltages for demultiplexer 130. Therefore, it is important to prevent ink from shorting the control leads to the high current leads.

In order to adhesively affix the top surface of barrier layer 126 to the back surface of tape 58, shown in FIG. 11, a thin adhesive layer 132, such as an uncured layer of poly-isoprene photoresist, is applied to the top surface of barrier layer 126. A separate adhesive layer may not be necessary if the top of the barrier layer 126 can be otherwise made adhesive. The resulting substrate structure is then positioned with respect to the back surface of tape 58 in FIG. 11 so as to align the resistors 122 with the orifices formed in tape 58. Conductors 72 are then bonded to electrodes 128. The aligned and bonded substrate/tape structure is then heated while applying pressure to cure adhesive layer 132 and firmly affix substrate 120 to the back surface of tape 58, as shown in FIG. 11.

In one embodiment, the resulting structure of FIG. 11 is then placed on the headland pattern 136 shown in FIGS. 12, after an adhesive has been dispensed on inner wall 138 and on substrate supports 140 and 142. This causes the adhesive on substrate supports 140 and 142 to displace up to insulate conductors 72 (FIG. 11) from ink. The adhesive on wall 138 and supports 140 and 142 also secures the printhead to the print cartridge 50 and creates an ink seal around the substrate 120.

The action of the adhesive on supports 140 and 142 in FIG. 12 displacing up to insulate conductors 72 is similar to that shown in FIGS. 5 and 6, where FIGS. 5 and 6 are taken along line A—A in FIG. 12. Inner wall 78 in FIGS. 5 and 6 is not used in the preferred embodiment of the headland in FIG. 12 but could be used. After encapsulant bead 96 (FIG. 6) is dispensed through windows 65 and 66 (FIG. 2), the conductors 72 are now completely insulated from ink by adhesive/PET layer 67, adhesive 90 and encapsulant 96.

FIG. 12 also shows hole 146 for allowing ink to flow from an ink reservoir 148, around the edges of substrate 120, and into vaporization chambers 124 in FIG. 11.

Figure 13A:
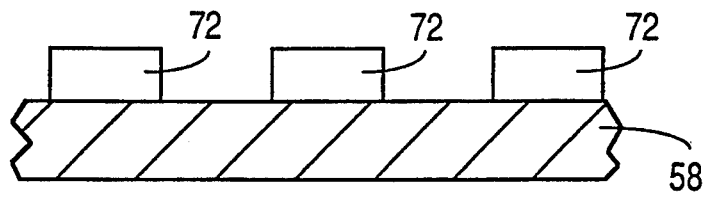
FIGS. 13a, 13b, and 13c are partial cross-sections taken along line A—A in FIG. 3 illustrating the sealing of conductors using a three-layer coating.
Figure 13B:
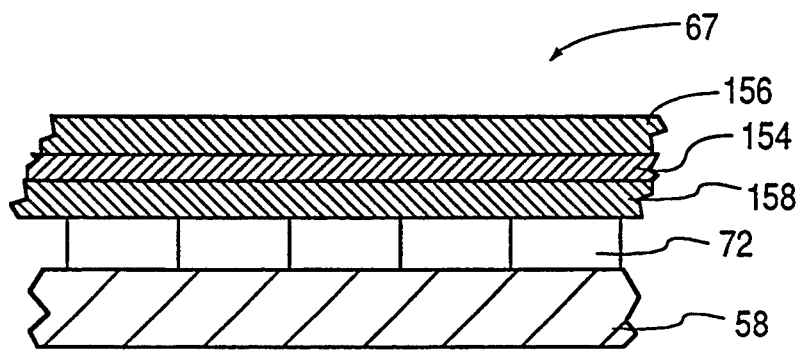
Figure 13C:
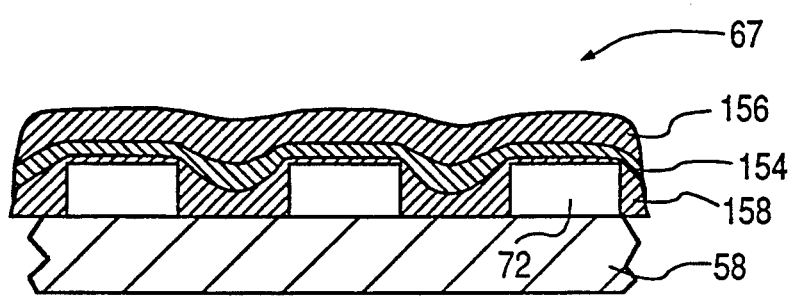

FIGS. 13a, 13b, and 13c illustrate more detail regarding the three-layer coating 67 laminated over the tape 58 and conductors 72 in FIG. 3. FIGS. 13a–13c are taken along line A—A in FIG. 3. The starting material in FIG. 13a is flexible tape 58, preferably formed of a polyimide, having conductors 72 formed thereon, as previously described. The three-layer coating 67 is then aligned with respect to tape 58 and tacked in place on tape 58.

Coating 67 comprises a middle layer 154 of PET approximately 0.4 mils thick. The two outer layers 156 and 158 are composed of a copolyester film approximately 1.0 mil thick. In one embodiment, the top outer layer 156 is formed of ethyl vinyl acetate (EVA), and the bottom layer 158 is formed of either EVA or ethyl acrylic acid (EAA). The materials comprising layers 156 and 158 are typically designed to withstand temperatures of 200° C. and above. Preferably, layer 156 has a lower softening temperature than layer 158. The three layers 154, 156, and 158 are laminated together and provided on a roll approximately 1.5 inches wide.

In the preferred embodiment, a strip of coating 67 is subjected to progressive die sets, where a first die set provides sprocket feed holes along the edges of the three-layer coating 67 to facilitate handling of coating 67 in a step-and-repeat process. In a second die set, all interior features are punched to match the openings formed in tape 58, shown in FIGS. 2 and 3. The strip of coating 67 is then cut to the required size for an individual print cartridge.

An automatic pick-and-place machine then transfers the strip of coating 67 to tape 58 (as shown in FIG. 13b) and tacks coating 67 in place on tape 58. Tape 58 will then advance to a laminator, where coating 67 is then laminated to the back surface of tape 58 by applying heat and pressure so that layer 158 flows around conductors 72 to provide the protective function of coating 67. FIG. 13c shows coating 67 after the lamination process.

After bonding a printhead die to conductors 72 on tape 58, the resulting flexible circuit is ready to be attached to a print cartridge body. Attachment of the flexible circuit to a print cartridge body is done by the use of heated pressure pads, applied first to the area just outside the die and then to the area of the interconnect pads formed on tape 58. In this process, the adhesive function of coating 67 is accomplished by causing the top adhesive layer 156 to soften and made to adhere to the plastic print cartridge body. A bonding of the adhesive layer 156 to the headland pattern 74 of a print cartridge body is shown in FIG. 13d and in FIG. 6.

Figure 13D:
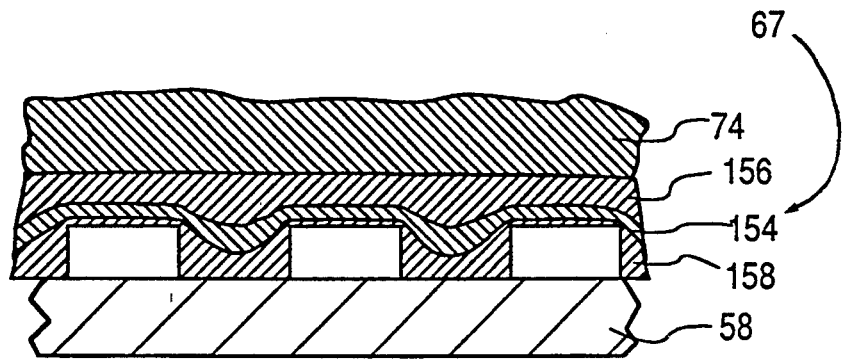
FIG. 13d is a partial cross-section showing the structure of FIG. 13c being secured to the print cartridge body in FIG. 6.

Being void-free, as illustrated in FIG. 13d, coating 67 is not prone to the same kind of failures that are seen with other forms of insulating materials, such as hot melts. Coating 67 is not stretchy or tacky, and thus can be easily punched and handled by high-speed automated equipment. The ability to withstand high temperatures is also an advantage over hot melts.

Thus, a structure and method for preventing ink shorts in a print assembly have been described. The precise shapes and dimensions of headland patterns will be determined by the type of printhead structure used.

The foregoing has described the principles, preferred embodiments and modes of operation of the present invention. However, the invention should not be construed as being limited to the particular embodiments discussed. As an example, the above-described inventions can be used in conjunction with inkjet printers that are not of the thermal type, as well as inkjet printers that are of the thermal type. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A structure for preventing ink shorting of conductors connected to a printhead, said structure comprising:
   a tape of a first insulating material having conductors formed on a surface thereof;
   an insulating layer of a second insulating material formed over said conductors to at least partially encapsulate said conductors, said conductors having ends extending from said layer, said second insulating material being different from said first insulating material;
   a printhead substrate having electrodes connected to said ends of said conductors;
   an ink reservoir in fluid communication with said printhead substrate, said layer for preventing ink shorting of said conductors,
   wherein said layer comprises a first thermoplastic adhesive layer, a polymer film layer, and a second thermoplastic adhesive layer.

2. A structure for preventing ink shorting of conductors connected to a printhead, said structure comprising:
   a tape of a first insulating material having conductors formed on a surface thereof;
   an insulating layer of a second insulating material formed over said conductors and partially encapsulating said conductors, said conductors having ends extending from said layer, said second insulating material being different from said first insulating material;
   a printhead substrate having electrodes connected to said ends of said conductors;
   an ink reservoir in fluid communication with said printhead substrate, said layer for preventing ink shorting of said conductors;
   a headland pattern formed on said ink reservoir proximate to an opening on said ink reservoir in fluid communication with said ink reservoir, said headland pattern having an outer wall and an inner wall, said inner wall surrounding said opening, said outer wall surrounding said inner wall;
   said printhead substrate having one or more edges, and having said conductors extending from said one or more edges, said printhead substrate being positioned on said headland pattern to allow ink to be supplied to said printhead substrate; and
   a third insulating material deposited on said headland pattern between said inner wall and said outer wall, said third insulating material encapsulating ends of said conductors, and thereby insulating said conductors from said ink, when said substrate and said conductors are pressed onto said headland pattern and said third insulating material.

3. The structure of claim 2 wherein said substrate is substantially rectangular and has one or more of said edges which overlie a portion of said headland pattern between said inner wall and said outer wall.

4. The structure of claim 2 wherein said headland pattern further includes a middle wall located between said inner wall and said outer wall, wherein said third insulating material is deposited on said middle wall and encapsulates, and thereby insulates, said conductors extending from said one or more edges of said substrate when said substrate is pressed down on said headland pattern.

5. The structure of claim 4 further comprising an adhesive deposited between said middle wall and said inner wall for securing said substrate to said ink reservoir.

6. The structure of claim 2 wherein said substrate is substantially rectangular and has two parallel first edges and two parallel second edges, where said second edges are shorter than said first edges, and wherein said conductors extend from one or both of said first edges of said substrate.

7. The structure of claim 2 wherein said substrate is substantially rectangular and has two parallel first edges and two parallel second edges, where said second edges are shorter than said first edges, and wherein said conductors extend from one or both of said second edges of said substrate.

8. The structure of claim 2 wherein said third insulating material is also an adhesive, said adhesive contacting both said printhead substrate and said headland pattern to secure said printhead substrate to said headland pattern on said ink reservoir as well as insulate said conductors from said ink when said printhead substrate and said conductors are pressed onto said headland pattern and said third insulating material.

9. The structure of claim 2 wherein said printhead substrate includes a demultiplexing/decoder circuit for demultiplexing/decoding signals applied to said electrodes through said conductors.

10. The structure of claim 2 further comprising a fourth insulating material deposited directly on end portions of said conductors extending from said substrate which have not been encapsulated by said second insulating material or said third insulating material to completely insulate said conductors extending from said substrate.

* * * * *